United States Patent [19]

Bullock et al.

[11] Patent Number: 4,726,035

[45] Date of Patent: Feb. 16, 1988

[54] ANALOG/DIGITAL ADAPTIVE LINE ENHANCER

[75] Inventors: Scott R. Bullock, West Jordan; Patrick J. Smith, Salt Lake City, both of Utah

[73] Assignee: Unisys Corporation, Blue Bell, Pa.

[21] Appl. No.: 30,301

[22] Filed: Mar. 26, 1987

[51] Int. Cl.$^4$ ............................................. H04B 3/14
[52] U.S. Cl. ...................................... 375/14; 333/18; 364/825
[58] Field of Search ..................... 379/394, 398, 414; 364/724, 825; 375/11, 12, 14, 103; 328/162, 163, 165, 166; 333/18, 28; 455/63, 303, 306, 307

[56] References Cited

U.S. PATENT DOCUMENTS

| | | | |
|---|---|---|---|
| 4,236,224 | 11/1980 | Chang | 364/724 |
| 4,238,746 | 12/1980 | McCool et al. | 333/166 |
| 4,266,204 | 5/1981 | Jacoby | 333/28 R |
| 4,351,060 | 9/1982 | Treiber | 364/724 |

*Primary Examiner*—Benedict V. Safourek
*Attorney, Agent, or Firm*—Glenn W. Bowen; Laurence J. Marhoefer

[57] ABSTRACT

The reference channel, the narrowband channel, and the error feedback channel are all constructed with analog components, while the adaptive processor is constructed with digital components. Unavoidable analog time delays in the narrowband and the error feedback channels are compensated for in the digital adaptive processor. The adaptive line enhancer described herein employs a local oscillator signal which is mixed with the input signal in a reference channel, which is subsequently converted to a digital signal. A digitized reference signal is supplied to an adaptive filter as an input signal. The adjustable weight values of the adaptive filter are adjusted by a feedback digitized signal. The output signal is derived from the subtraction of a narrowband analog signal, which is derived from the adaptive filter. The error feedback signal is split off of the output signal, mixed with the local oscillator signal, and supplied to the weight update mechanisms.

4 Claims, 1 Drawing Figure

ANALOG/DIGITAL ADAPTIVE LINE ENHANCER

BACKGROUND OF THE INVENTION

Both digital and analog adaptive line enhancers act as narrowband filters to enhance the narrowband frequency components present in a broadband noise field. Adaptive line enhancers are constructed so that they automatically adjust to variations in the input signal in order to provide a least mean square (LMS) approximation of a WienerHopf filter. This device uses a number of stored weight values which are continuously adjusted so that the device automatically filters out the components of the signal which are not correlated in time in order to pass correlated stable spectral lines.

The McCool et al U.S. Pat. No. 4,238,746 issued Dec. 9, 1980 entitled "Adaptive Line Enhancer," the McCool et al U.S. Pat. No. 4,243,935 issued Jan. 6, 1981 entitled "Adaptive Detector" and the article entitled "The Time-Sequenced Adaptive Filter" by Ferrara, Jr. and Widro which was published 1981 in the IEEE Transactions on Circuits and Systems, Vol. CAS-28 (1981) June N 6, New York USA show prior art devices and/or provide discussions of the theoretical basis of the adaptive line enhancer.

SUMMARY OF THE INVENTION

The present invention provides a digital adaptive processor which operates with analog signals that are supplied on the reference and the error feedback channels and which provides an analog narrowband channel output signal. In the most general form the invention includes up/down conversion, and lowpass and bandpass filtering in order to process any preset frequency band. In the configuration of the disclosed embodiment, adaptive line enhancers may be extended to frequency bands beyond the range of currently available digital components, while retaining the advantages of digital adaptive processors.

BRIEF DESCRIPTION OF THE DRAWINGS

The present invention is described by reference to the FIGURE which shows a block diagram of an analog/digital adaptive line enhancer constructed in accordance with the present invention.

TECHNICAL DESCRIPTION OF THE INVENTION

Figure 1:
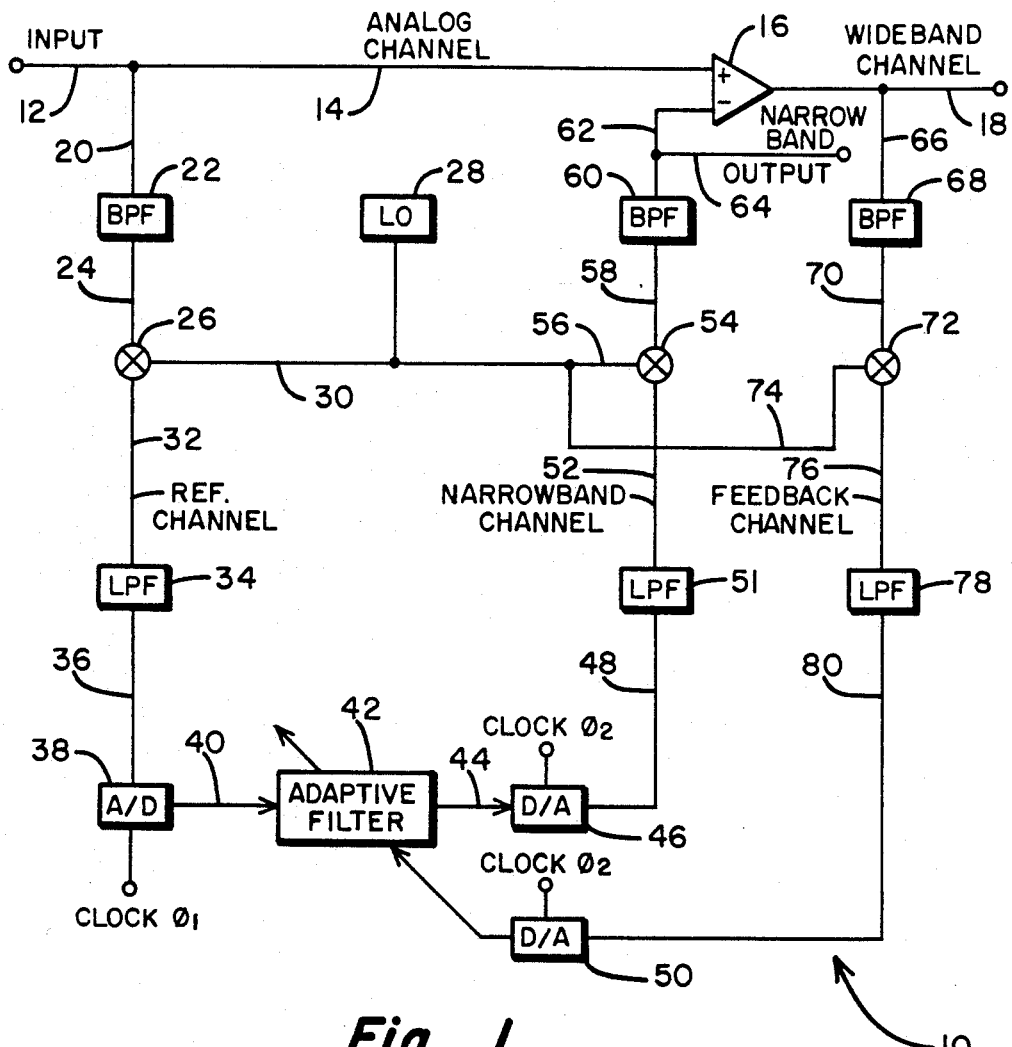

The adaptive line enhancer 10 which is shown FIG. 1 receives an analog input signal on the line 12. This signal is passed on the line 14 which is labeled "ANALOG CHANNEL" to the non-inverting input of an analog summer. The Analog signal on the line 14 contains both wideband and narrowband components. The WIDEBAND CHANNEL output signal is supplied by the analog summer 16 on the output line 18 after the NARROWBAND CHANNEL signal has been subtracted from the ANALOG CHANNEL signal in the analog summer due to the application of the NARROWBAND CHANNEL signal to the inverting input terminal of the analog summer 16.

In order to develop the NARROWBAND CHANNEL signal, the analog input signal is coupled on the line 20 to a bandpass filter 22. The output of the bandpass filter 22 is coupled on the line 24 to a mixer, or signal multiplier, 26. Another input of the multiplier 26 receives the output of a stable local oscillator 28 on the line 30. The bandpass filter 22 is ideally constructed so that it passes a flatband of signals, with the frequency of the local oscillator being at the lowermost end of the frequency band. Thus, the output of the mixer supplied on the line 32 contains the mixed signals supplied by the bandpass filter which extends from the local oscillator frequency to the upper frequency of the present frequency band to be processed by the adaptive filter.

The lowpass filter 34 which receives the signal on the line 32 ideally will pass signals on the line 36 to the analog/digital converter 38 from D.C. to a frequency which is well below that of the local oscillator. Thus, in the REFERENCE CHANNEL the power tapped from the input signal is bandpass filtered and down converted to baseband. A lowpass filter is then used to further restrict the bandwidth of the mixed reference signal to the Nyquist frequency of the digital adaptive filter.

The digital output of the A/D converter 38 is supplied on the line 40 to the adaptive filter 42. In an adaptive filter there are a number of weight accumulators which store weight values. The signal from the A/D converter is supplied through a decorrelation delay to a number of taps of a tapped delay line. The digital NARROWBAND CHANNEL signal of the adaptive filter is provided on the line 44 to a digital/analog output converter 46. The output of the D/A converter 46 is supplied on the line 48 to derive the narrowband signal. While the delay may be adjusted in an integral number of clock cycles by adding more taps and by shifting the narrowband output taps from the weight update taps, it may be found that the time delay through the feedback loop is not exactly an integral number of clock cycles. Adjustments for time variations less than one clock cycle period may be provided by relative timing differences between clock $\phi 1$ for D/A converter 46 and clock $\phi 2$ for A/D converter 38. For example, this may be done by triggering the A/D converter 38 off of the rising edges of clock $\phi 1$ and $\phi 2$ triggering the D/A converter 46 off of the following edges of clock $\phi 2$ wherein clock $\phi 2$ is delayed in time from clock $\phi 1$ sufficiently to provide the appropriate timing adjustment. For example, if it is assumed that the actual delay through the feedback loop is 2.7 clock cycles, and three additional taps have been added to provide three additional clock delay cycles in triggering the D/A converter 46, then the timing of the A/D converter 38 will be early by 0.3 clock cycles. This 0.3 clock cycle difference may be adjusted by controlling the timing of the D/A converter 46 and the A/D converters 38 and 50.

The NARROWBAND CHANNEL signal on line 48 is supplied to the lowpass filter 51 which is used to eliminate the high frequency transition components from the D/A converters. The signal is then passed on line 52 to the mixer 54. The mixer 54 receives the local oscillator signal on the line 56 and the NARROWBAND CHANNEL mixed output signal is supplied on the line 58 to the bandpass filter 60. The output of the bandpass filter 60 is supplied on the line 62 to the inverting input terminal of the analog summer 16. The bandpass filter 60 is used to eliminate the lower sideband generated by the up conversion that occurred at the mixer 54. The NARROWBAND CHANNEL output may be supplied on the line 64.

The error signal to update the accumulator weights is split off from the WIDEBAND CHANNEL on the line 66 through the bandpass filter 68. The signal on the line 66 is passed through bandpass filter 68 to the line 70.

The bandpass filter 68 has a frequency band identical to that of the bandpass filter 22 so that its band extends at the lower end from the frequency of the local oscillator to a higher frequency.

The output of the bandpass filter is supplied on the line 70 to the mixer 72 which also receives the local oscillator signal on line 74. Like the REFERENCE CHANNEL, there is again a down conversion and the resulting signal is supplied on the line 76 of the FEEDBACK CHANNEL.

This signal is then passed through the lowpass filter 78 and applied on the line 80 to an analog/digital converter 50. The lowpass filter 78, like the lowpass filter 34, is constructed to pass a flatband from D.C. to a frequency well below the local oscillator frequency. The lowpass filters 34 and 78 in both the reference and error feedback channels are used to band limit the reference and error feedback signals to the Nyquist rate of the digital adaptive processor. The digitized output of the A/D converter 50 is supplied to the adaptive filter 42 as an error signal which controls the updating of the weights of the adaptive filter 42.

The construction of the adaptive line enhancer of the present invention, in which analog components are utilized, to allow the narrowband interference to be directly subtracted from the input signal without further distortion being introduced. This adaptive line enhancer also represents a constant group delay to the input signal which is important to communication applications.

The utility of such devices to frequency bands well beyond the range of conventional digital ALE designs. This device extends the frequency range of the ALE without digitizing the input signal, while retaining the advantages of digital adaptive processing.

We claim:

1. An adaptive line enhancer comprising,
    an input channel carrying analog input signals,
    local oscillator means for providing a local oscillator signal,
    a reference channel comprising a first mixing means for mixing a sample of said analog input signals with said local oscillator signal to provide an analog reference channel signal,
    first analog-to-digital converter means for converting said analog reference channel signal to a digitized reference signal,
    digital adaptive filter means constructed to receive said digitized reference signal as an input signal and to provide a digitized filter signal, said adaptive filter means having a plurality of adjustable weight accumulating means,
    second analog-to-digital converter means for providing an analog feedback signal to said adaptive filter means for adjusting the weight values of said weight accumulator means,
    digital-to-analog converter means coupled to receive said filter signal from said adaptive filter means for supplying an analog narrowband channel signal,
    second signal mixing means for mixing said narrowband channel analog signal and said local oscillator signal to provide a narrowband output signal,
    subtraction means, having an output terminal and constructed for subtracting said narrowband signal and said input signal and for supplying a wideband channel signal on said output terminal,
    third mixing means for mixing a sample of said wideband channel signal and said local oscillator signal and for providing an analog feedback channel signal to said second analog-to-digital converter means, and
    clock means for clocking said digital-to-analog converter means and said first and second analog-to-digital converter means.

2. An adaptive line enhancer as claimed in claim 1 comprising first bandpass filter means coupled between said input channel and said first mixing means, and
    second bandpass filter means coupled between said second mixing means and said subtraction means, and
    third bandpass filter means coupled between said output terminal of said subtraction means and said third mixing means, wherein all of said bandpass filter means are designed to pass signals from a lower frequency which is approximately equal to said local oscillator signal to a predetermined higher frequency.

3. An adaptive line enhancer as claimed in claim 1 comprising
    first lowpass filter means is coupled between said first mixing means and said first analog-to-digital converter means,
    second lowpass filter means coupled between said second digital-to-analog converter means and said second mixing means, and
    third lowpass filter coupled between said third mixing means and said second analog-to-digital converter means, wherein all of said lowpass filter means are designed to pass signals from D.C. to a predetermined frequency which is substantially lower than said local oscillator signal.

4. An adaptive line enhancer as claimed in claim 3 comprising first bandpass filter means coupled between said input channel and said first mixing means, and
    second bandpass filter means coupled between said second mixing means and said subtraction means, and
    third bandpass filter means coupled between said output terminal of said subtraction means and said third mixing means, wherein all of said bandpass filter means are designed to pass signals from a lower frequency which is approximately equal to said local oscillator signal to a predetermined higher frequency.

* * * * *